US007782653B2

United States Patent
Hashimoto

(10) Patent No.: US 7,782,653 B2
(45) Date of Patent: Aug. 24, 2010

(54) SEMICONDUCTOR MEMORY DEVICE AND METHOD OF OPERATING THE SEMICONDUCTOR MEMORY DEVICE

(75) Inventor: Shingo Hashimoto, Yamagata (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 133 days.

(21) Appl. No.: 11/808,991

(22) Filed: Jun. 14, 2007

(65) Prior Publication Data

US 2007/0297215 A1    Dec. 27, 2007

(30) Foreign Application Priority Data

Jun. 23, 2006    (JP)    .............. 2006-174498

(51) Int. Cl.
  *G11C 11/00*    (2006.01)
(52) U.S. Cl. .................. 365/154; 365/149; 365/185.26
(58) Field of Classification Search ................ 365/154,
  365/149, 185.26, 145, 65, 117, 185.23, 104,
  365/189.03
See application file for complete search history.

(56) References Cited

U.S. PATENT DOCUMENTS

| 4,638,463 | A |   | 1/1987 | Rockett, Jr. | |
| 5,481,492 | A | * | 1/1996 | Schoemaker | 365/185.23 |
| 5,629,888 | A | * | 5/1997 | Saito et al. | 365/145 |
| 6,198,652 | B1 | * | 3/2001 | Kawakubo et al. | 365/145 |
| 7,078,774 | B2 | * | 7/2006 | Kondo et al. | 257/371 |
| 2004/0008550 | A1 | * | 1/2004 | Son et al. | 365/200 |

FOREIGN PATENT DOCUMENTS

| JP | 8-46060 | 2/1996 |
| KR | 10-0305123 B1 | 11/2001 |

OTHER PUBLICATIONS

Korean Office Action dated Feb. 5, 2009 with partial English-language translation.

* cited by examiner

*Primary Examiner*—Dang T Nguyen
(74) *Attorney, Agent, or Firm*—McGinn IP Law Group, PLLC

(57) ABSTRACT

A pair of memory nodes, a capacitor of which one end is connected to the memory nodes, and a switch part which is connected to the other end of the capacitor, and changes a connection state of the other end of the capacitor when a semiconductor memory device operates at a speed not lower than a predetermined speed are included. By changing the connection state of the other end of the capacitor in accordance with the operation state of the semiconductor memory device like this, the influence which the capacitor connected to the memory node exerts on the operation speed of the semiconductor memory device can be suppressed.

6 Claims, 7 Drawing Sheets

| OPERATION STATE OF SRAM1 | NODE OF SWa | THE OTHER END OF CAPACITOR |
|---|---|---|
| FIRST OPERATION STATE (PREDETERMINED SPEED OR HIGHER) | VIRTUAL CONTACT NODE B | FLOATING |
| SECOND OPERATION STATE (PREDETERMINED SPEED OR LOWER STANDBY STATE) | NODE A | GND POTENTIAL |

Fig. 7

| OPERATION STATE OF SRAM1 | CONTACT POINT OF SWa | THE OTHER END OF CAPACITOR |
|---|---|---|
| FIRST OPERATION STATE (PREDETERMINED SPEED OR HIGHER) | VIRTUAL CONTACT NODE B | FLOATING |
| SECOND OPERATION STATE (PREDETERMINED SPEED OR LOWER OR STANDBY STATE) | CONTACT NODE A (D) | GND(VCC) |
| THIRD OPERATION STATE (PELIABILTIY INSPECTION TIME) | CONTACT NODE C | VCC/2 |

SEMICONDUCTOR MEMORY DEVICE AND METHOD OF OPERATING THE SEMICONDUCTOR MEMORY DEVICE

BACKGROUND OF THE INVENTION

1. Field of the Invention

The present invention relates to a semiconductor memory device and a method of operating the semiconductor memory device.

2. Description of Related Art

In recent years, reduction in chip size and increase in capacity of memories have been advanced. With this, semiconductor memory devices (for example, SRAM) are desired to include high SER (Soft Error Rate) resistance.

Typically, in order to enhance SER resistance, a CR time constant circuit based on capacity and resistance with respect to a memory node (cross-coupled node) of a memory cell of a SRAM is connected, or the capacity of a cross-coupled node itself is increased to increase an accumulated electric charge amount. However, with a method of simply increasing the capacity, the operation speed of a SRAM reduces. In Japanese Patent Laid-Open No. 8-46060, the operation condition at the time of write is improved by setting the potential of a capacitive plate at a low level at the time of write of data (at the time of a storing operation). In other words, in the SRAM adopting a TFT and including a capacitive plate electrode, the influence of the potential of the capacitive plate electrode is relieved.

When a data reading or writing operation is continuously performed for a SRAM, a cross-coupled node continuously repeats the state of H (high) or L (Low), and in such a case, if a subsidiary capacitor is formed in the cross-coupled node, change of the potential level (H or L) becomes slow, and as a result, there arises the problem of reducing the operation speed of the SRAM. In other words, in order to enhance the SER resistance of a SRAM, a capacitor is preferably added to the cross-coupled node, but from the viewpoint of realizing the high-speed operation of the SRAM, it is not preferable to add a capacitor to the cross-coupled node. In Japanese Patent Laid-Open No. 8-46060, consideration is not given to this respect at all.

As described above, with the semiconductor memory device of related art, it is difficult to realize high SER resistance while satisfying the operation speed of the semiconductor memory device.

SUMMARY OF THE INVENTION

As a aspect of embodiments, a semiconductor memory device, comprising: a memory circuit containing a pair of memory nodes;

a capacitor having a first end and a second end, the first end being connected to the memory nodes; and a switch connected to the second end of the capacitor and changing a state of the second end when the semiconductor memory device operates at a predetermined speed or higher.

As another aspect of the embodiments 10. A method of operating a semiconductor memory device including a capacitor including a first end connected to memory node and a second end, comprising: setting the second end to a first state when the semiconductor memory device operates at a speed a predetermined speed or higher; and setting the second end to a second state when the semiconductor memory device operates at a speed less than the predetermined speed.

As to another aspect of the embodiments, a semiconductor memory device, comprising: a SRAM cell including at least a pair of memory nodes; a first capacitor element connected between one of the memory nodes and a connecting point; a second capacitor element connected between the other of the memory nodes and the connecting point; a switch which connects the connecting point and second capacitor elements and a power supply; and a control circuit controls the switch to cut off the connecting point from the power supply when the SRAM cell is in a predetermined operation state.

According to the above configuration, the connection state of the other end of the capacitor is changed in accordance with the operation state of the semiconductor memory device. Thereby, the influence which the capacitor connected to the memory node gives to the operation speed of the semiconductor memory device can be suppressed.

According to the semiconductor memory device of the present invention, high SER resistance can be realized while satisfying the operation speed of the semiconductor memory device.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 is a table for explaining that the state of the other end of the capacitor is changed based on the operation state of the SRAM 1.

DETAILED DESCRIPTION OF THE PREFERRED EMBODIMENTS

First Embodiment

Figure 1:
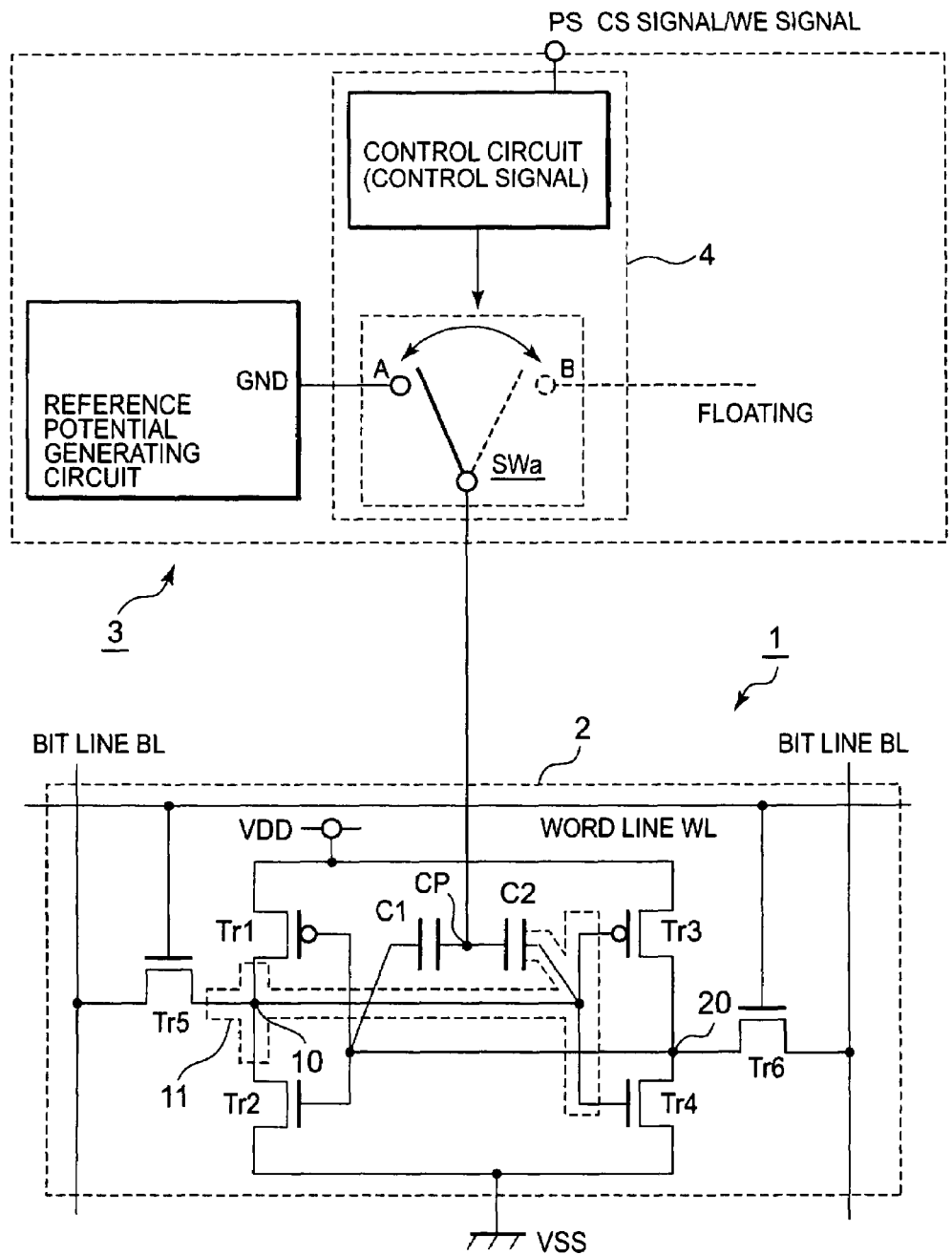
FIG. 1 is a schematic diagram for explaining the configuration of a semiconductor memory device according to a first embodiment.

As shown in FIG. 1, a semiconductor memory device (in this case, SRAM) 1 includes a memory cell (SRAM cell) 2 constituted of a plurality of CMOS transistors. The memory cell 2 has NMOS drive transistors Tr2 and Tr4, PMOS load transistors Tr1 and Tr3, and NMOS transfer transistors Tr5 and Tr6. A potential adjusting circuit 3 is electrically connected to the memory cell 2.

First, the configuration of the memory cell 2 will be described. The load transistor Tr1 and the drive transistor Tr2 are connected in series between a power supply potential VDD and a ground potential VSS. Gates of the load transistor Tr1 and the drive transistor Tr2 are connected to a node 20 between the load transistor Tr3 and the drive transistor Tr4, and the transfer transistor Tr6. One end of a capacitor C1 (first capacitor element) is connected to the node 20. The transfer transistor Tr6 is between the node 20 and a bit line BL, and its gate is connected to a word line WL. By pairing up with the above described configuration, the load transistor Tr3 and the drive transistor Tr4 are connected in series between the power supply potential VDD and the ground potential VSS. Gates of the load transistor Tr3 and the drive transistor Tr4 are connected to a node 10 between the load transistor Tr1 and the drive transistor Tr2, and the transfer transistor Tr5. One end of a capacitor C2 (second capacitor element) is connected to the node 10. The transfer transistor Tr5 is between the node 10 and the bit line BL, and its gate is connected to the word line WL.

As shown in FIG. 1, a first memory node (cross-coupled node) 11 includes a wiring region ranging from the gates of the transistors Tr3 and Tr4 to the transistor Tr5, and a wiring region ranging from the node 10 to one end of the capacitor C2. On the other hand, a second memory node (cross-coupled node) 12 (not shown in FIG. 1 for convenience of explanation. shown in FIG. 3) paired with the cross-coupled node 11 includes a wiring region ranging from the gates of the transistors Tr1 and Tr2 to the transistor Tr6, and a wiring region ranging from the node 20 to one end of the capacitor C1. These cross-coupled nodes 11 and 12 have the potentials of the power supply potential VDD or ground potential VSS, and the potentials vary in accordance with the stored information.

The memory cell 2 operates as follows. An H (High level) signal or an L (Low level) signal is written to the cross-coupled node 11 and the cross-coupled node 12 via the transfer transistors Tr5 and Tr6 based on the H signal or the L signal from the bit lines BL (write operation). The H signal or the L signal written to the cross-coupled nodes 11 and 12 is outputted to the bit lines BL via the transfer transistors Tr5 and Tr6 (read operation).

In this embodiment, the memory cell 2 has the capacitor C2 of which one end is connected to the cross-coupled node 11, and the capacitor C1 of which one end is connected to the cross-coupled node 12. The other ends of the capacitors C1 and C2 are connected to each other. The potential adjusting circuit 3 is electrically connected to a node CP in the wiring connecting the other ends of the capacitors C1 and C2.

The potential adjusting circuit 3 has a switch circuit 4 having a switch part SWa and a control circuit, and a reference potential generating circuit (power supply). The potential adjusting circuit 3 adjusts the potential of the node CP, that is, the potential of the other ends of the capacitors C1 and C2 based on the operation state of the SRAM 1. In other words, by adjusting the potential of the node CP (adjusting the potential of the other ends of the capacitors C1 and C2), the retention capacitances of the capacitors C1 and C2 specified by the potential differences between the one ends and the other ends of the capacitors C1 and C2 are adjusted.

In this embodiment, the switch part SWa selects either a contact point A or a virtual contact point B, and thereby, changes the potential of the node CP, that is, the potentials of the other ends of the capacitors C1 and C2 to adjust the retention capacitances of the capacitors C1 and C2. In this case, the contact point A is connected to the ground potential GND (first potential) of the reference potential generating circuit. On the other hand, the virtual contact point B is in a floating state. When the contact point A is selected by the operation of the switch part SWa, the node CP is fixed to the ground potential GND. On the other hand, when the virtual contact point B is selected, the node CP is in the floating state. The switch part SWa is constituted, for example, of a field effect transistor (FET).

The control circuit controls the switch part SWa based on the operation state of the SRAM 1 (predetermined operation state of the SRAM cell 2). Namely, when the SRAM 1 performs a write or read operation at a speed of not lower than a predetermined speed (at a high speed) (first operation state), a higher priority is given to the operation speed of the SRAM 1 than to the SER resistance, and therefore, the control circuit conducts control so that the switch part SWa selects the virtual contact point B. On the other hand, when the SRAM 1 performs a write or read operation at a speed not higher than a predetermined speed (at a low speed), or when the SRAM 1 is in a standby state (second operation state), a higher-priority is given to the SER resistance than to the operation speed of the SRAM 1, and therefore, the control circuit conducts control so that the switch part SWa selects the contact point A.

The state in which the SRAM 1 is under a read or write operation may be set as the first operation state, and the state in which the SRAM 1 is in the standby state may be set as the second operation state. In this case, as in the explanation which will be described later, if the SRAM 1 is under a read or write operation, a higher priority can be given to the operation speed of the SRAM 1 than to the SER resistance. As in the explanation which will be made later, if the SRAM 1 is in the standby state, a higher priority can be given to the SER resistance than to the operation speed of the SRAM 1.

When the switch part SWa selects the virtual contact point B based on the control signal from the control circuit, the node CP is in the floating state, and the other ends of the capacitors C1 and C2 are also in the floating state. At this time, the capacitors C1 and C2 are in the state in which they are connected in series between a pair of cross-coupled nodes 11 and 12. The retention capacitances of the capacitors C1 and C2 become the minimum. Accordingly, as compared with the case where the potential of the node CP is fixed, the influence exerted on the operation speed of the SRAM 1 by the capacitors C1 and C2 can be suppressed. Namely, a higher priority can be given to the operation speed of the SRAM 1 than to the SER resistance. The control signal given to the switch part SWa from the control circuit is a signal showing the operation state of the memory cell 2, and is generated based on a chip select signal (CS signal) or a write signal (WE signal), or the like. In this case, a CS signal or a WE signal is given to a terminal PS connected to the control circuit.

On the other hand, when the switch part SWa selects the contact point A based on the control signal from the control circuit, the node CP is at the ground potential GND, and the other ends of the capacitors C1 and C2 are also set at the ground potential GND. At this time, the capacitors C1 and C2 each have a predetermined retention capacitance. Accordingly, the cross coupled-nodes 11 and 12 are in the state in which the capacitors C1 and C2 are added to them respectively, and they can store more electrical charges. Namely, a higher priority can be given to the SER resistance than the operation speed of the SRAM 1.

Figures 2, 3:
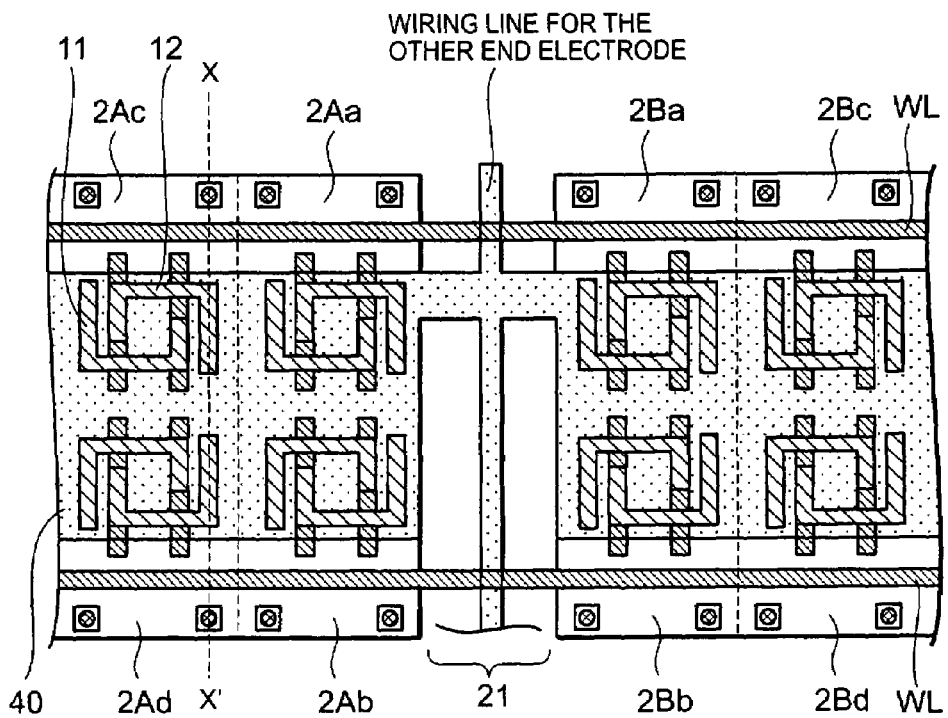
FIG. 2 is a table for explaining that the state of the other end of a capacitor is changed based on an operation state of a SRAM 1.
FIG. 3 is a schematic diagram showing the layout of the SRAM 1.

The above described explanation is organized as the table in FIG. 2. The control circuit itself may determine whether the SRAM 1 is in the first operation state or in the second operation state based on, for example, the information concerning the operation state of the SRAM 1, but the control circuit itself does not always have to determine it. It may be determined artificially.

Here, a schematic layout of the SRAM 1 is shown in FIG. 3. FIG. 3 shows the other end electrode 40 constituting the other ends of the capacitors 1 and 2. The other end electrode 40 is disposed to cover the cross-coupled nodes 11 and 12 in each of a plurality of memory cells 2Aa to 2Ad; and 2Ba to 2Bd. According to the configuration, the capacitors C1 and C2 can be more preferably added to the cross-coupled nodes 11 and 12.

A wiring line for the other end electrode which is electrically connected to the other end electrode 40 is provided in a wiring formation region 21 which is between a plurality of memory cells 2Aa to 2Ad, and a plurality of memory cells 2Ba to 2Bd. The wiring line for the other end electrode is electrically connected to the potential adjusting circuit 3 in FIG. 1 from the terminal on the chip of the SRAM 1. Other than this, the other end electrode 40 is extended to the area around the area in which the memory cells of the SRAM 1 are arranged, and the extended portion of the other end electrode and the potential adjusting circuit 3 may be electrically connected. In FIG. 3, for convenience of explanation, the VSS line, the VDD line, the bit line BL and the like are omitted.

Figure 4:
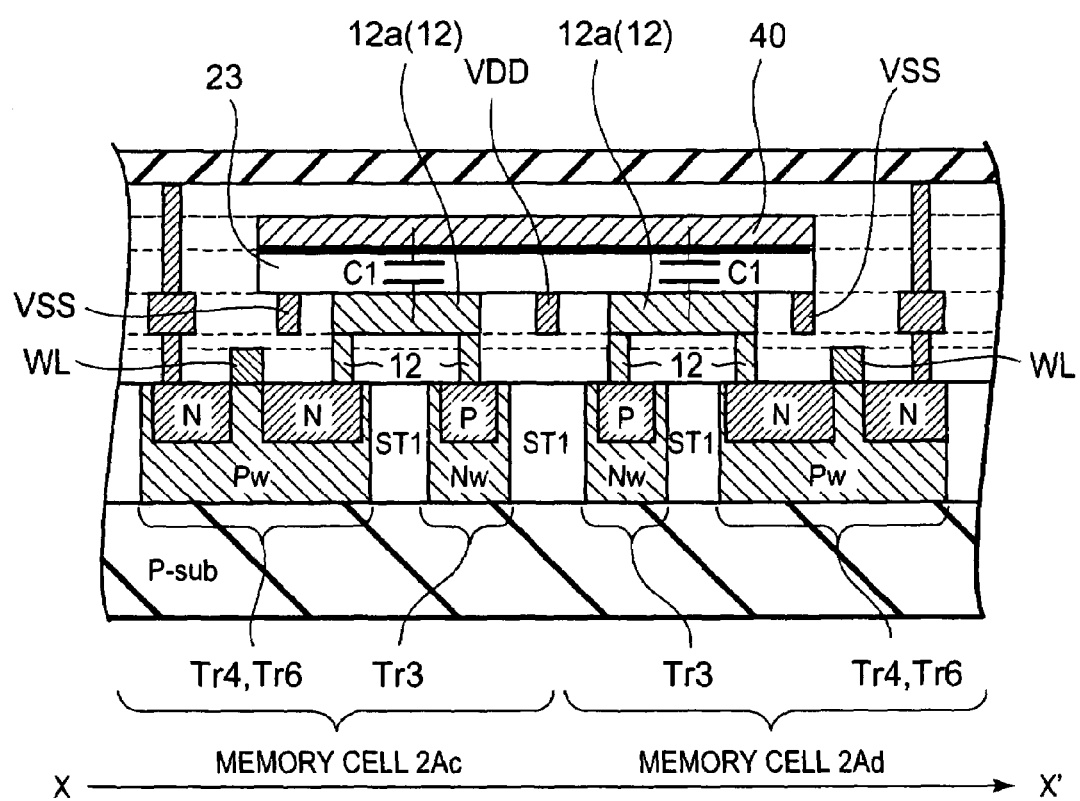
FIG. 4 is a schematic diagram showing a sectional configuration taken along X-X' in FIG. 3.

FIG. 4 shows a schematic sectional configuration taken along the X-X' line shown in FIG. 3. The size of the components or the like shown in FIG. 4 is only for explanation, and does not reflect the actual size.

As shown in FIG. 4, a dielectric film 23 is formed on the upper layer on upper nodes 12a constituting the cross-coupled nodes 12 of the memory cells 2Ac and 2Ad. The other end electrode 40 shown in the layout diagram of FIG. 3 is formed on the upper layer on the dielectric film 23. By such a configuration, as schematically shown in FIG. 4, the capacitors C1 can be formed between the cross-coupled nodes 12 and the other end electrode 40. Here, the upper node 12a of the cross-coupled node 12 constitutes one end of the capacitor.

In this case, the power supply lines (the VSS lines, the VDD line) and the upper nodes 12a of the cross-coupled nodes 12 are disposed in the same layer. The dielectric film 23 covers the power supply lines (the VDD line, the VSS lines) as well as the cross-coupled nodes 12. By such a configuration, the capacitors C1 and C2 can be preferably formed. The dielectric film 23 is constituted of a dielectric material, and can be constituted by using a material such as, for example, a silicon dioxide (SiO2), a silicon nitride (SiN), and a titanium oxide (TiO2).

Figure 5:
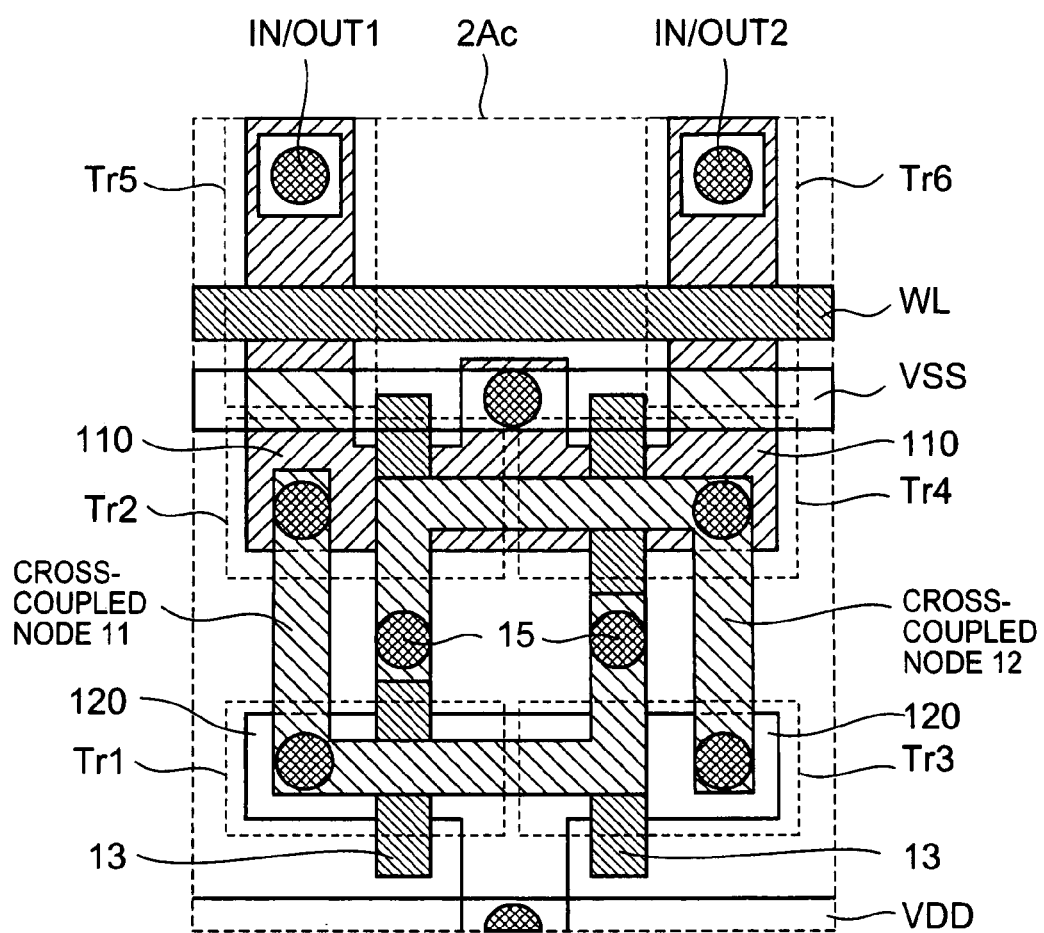
FIG. 5 is a schematic diagram showing the layout of a memory cell.

Here, FIG. 5 shows a schematic diagram of a layout of the memory cell 2Ac shown in FIG. 4. For clarifying the drawing, the other end electrode 40 is omitted here.

As shown in FIG. 5, the memory cell 2Ac has, in addition to the other end electrode 40 (not shown), diffusion regions 110 and 120, gate regions 13, the word line WL, the VDD line, the VSS line, the cross-coupled node 11, the cross-coupled node 12 and vias 15.

The diffusion regions 110 form sources or drains of the transistors Tr2, and Tr4 to Tr6. The diffusion regions 120 form sources or drains of the transistors Tr1 and Tr3. The gate regions 13 form gates of the transistors Tr1 to Tr4. The word line WL is formed as the gates of the transistors Tr5 and Tr6.

The cross-coupled node 11 is formed to connect the gates of the transistors Tr3 and Tr4 and the drains of the transistors Tr1 and Tr2. The cross-coupled node 12 is formed to connect the gates of the transistors Tr1 and Tr2 and the drains of the transistors Tr3 and Tr4. In the drawing, the drain of the transistor Tr2 and the source of the transistor Tr4 are connected by the diffusion region 110 integrally formed. The drain of the transistor Tr4 and the source of the transistor Tr6 are connected by the diffusion region 110 integrally formed.

Second Embodiment

Figure 6:
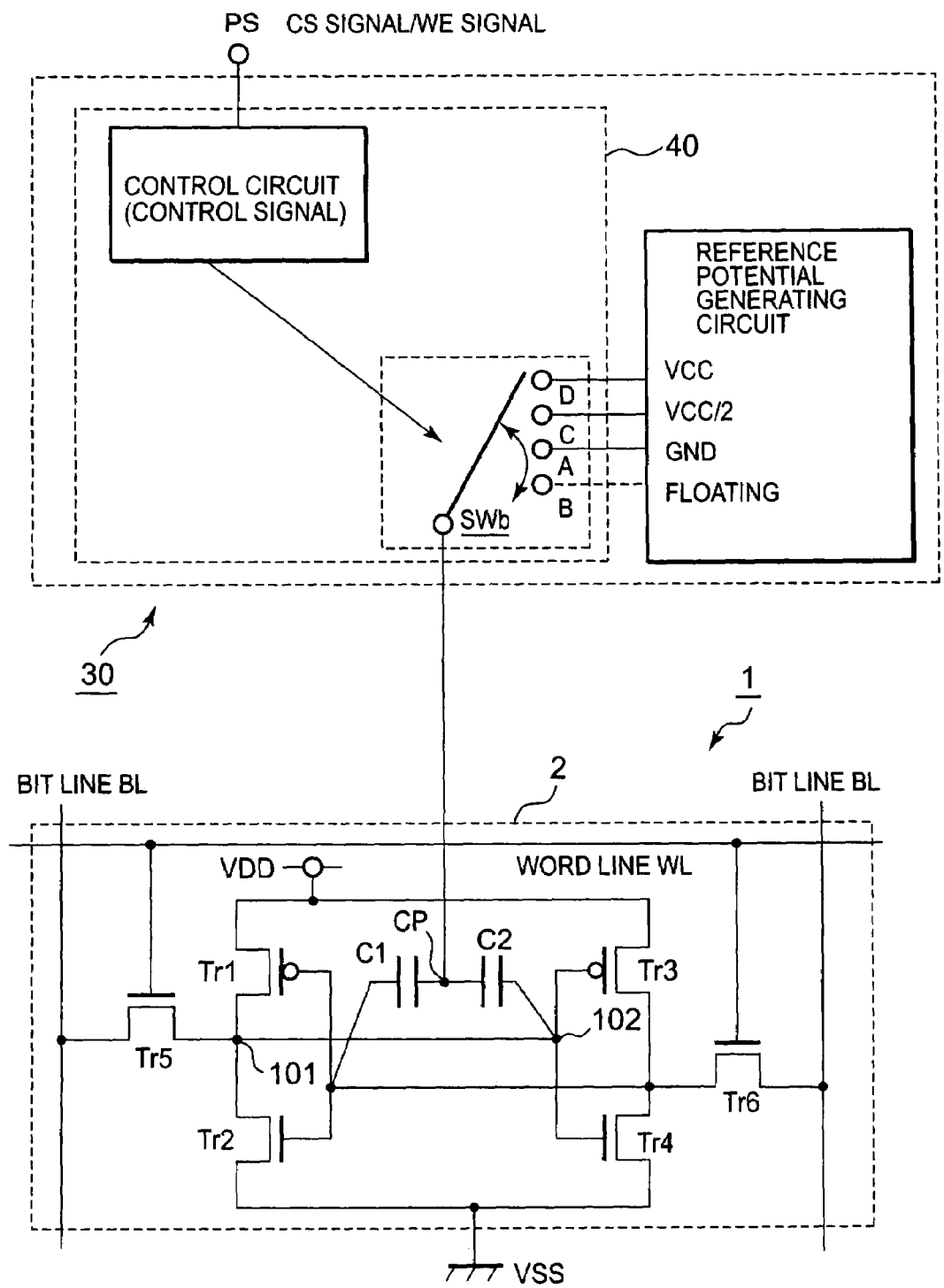
FIG. 6 is a schematic diagram for explaining the configuration of a semiconductor memory device according to a second embodiment.
Figure 8:
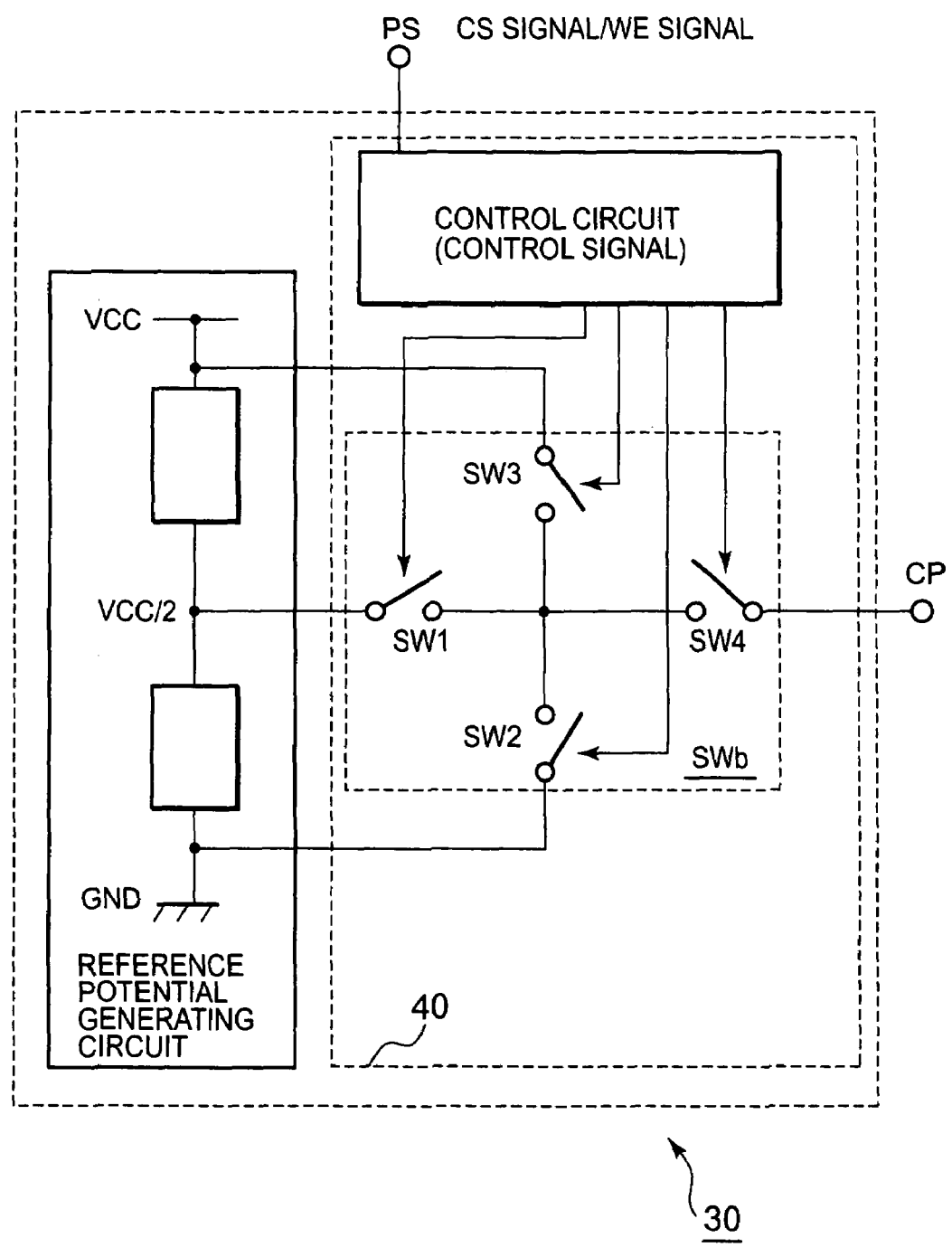
FIG. 8 is a schematic diagram for explaining a concrete example of a potential adjusting circuit 30.

Next, a second embodiment of the present invention will be described by using FIGS. 6, 7 and 8. The same elements are assigned with the same reference numerals and characters, and the redundant explanation will be omitted.

The second embodiment differs from the first embodiment in the respect of the configuration of a potential adjusting circuit 30. Namely, as shown in FIG. 6, a switch part SWb selects a contact point C which is connected to an intermediate potential VCC/2 (second potential) between the power supply potential VCC and the ground potential GND, and a contact point D which is connected to the power supply potential VCC (third potential) in addition to the contact point A which is connected to the ground potential GND and the virtual contact point B in a floating state, based on the control signal from the control circuit.

When the switch part SWb selects the contact point C of the VCC/2 potential based on the control signal from the control circuit, the operation state of the SRAM 1 is in the operation state (the third operation state) in which signal voltage higher than the ordinary case (for example, the case of the first operation state or the second operation state) is applied as an H signal, or signal voltage lower than the ordinary case (the same as above) is applied as an L signal, and a write operation is performed. In such a case, the switch part SWb selects the contact point C, and thereby, the respective dielectric films of the capacitors C1 and C2 hold the potential of the amount of difference between the VCC/2 potential applied to the other ends and the signal voltage which can be applied to the one ends. Accordingly, as compared with the case where the other ends of the capacitor C1 and the capacitor C2 are fixed to the power supply potential VCC or the ground potential GND, breakage of the dielectric film 23 can be suppressed even if the H signal higher than usual or the L signal lower than usual is applied. The third operation state is, for example, the operation state at the time of the reliability test of the SRAM 1.

When the switch part SWb selects the contact point D of VCC based on the control signal from the control circuit, the SRAM 1 operates at a lower speed, or the SRAM 1 is in a standby state (second operation state). When the switch part SWb selects the contact point D, VDD is applied to the other ends of the capacitors C1 and C2. At this time, the capacitors C1 and C2 each have a predetermined retention capacitance. Accordingly, the cross-coupled nodes 11 and 12 are in the state in which the capacitors C1 and C2 are added to them respectively (the state in which a CR time constant circuit is connected in series), and SER resistance is enhanced. Namely, a higher priority can be given to the SER resistance than to the operation speed of the SRAM 1. The above described explanation is organized as the table in FIG. 7.

Here, a concrete example of the potential adjusting circuit 30 will be described by using FIG. 8. At the time of the first operation state, the capacitances of the capacitors C1 and C2 become minimum by turning off an SW4. At the time of the second operation state, the SW4 is turned on, an SW1 is turned off, and either an SW2 or an SW3 is turned on. At this time, the capacitors C1 and C2 each have a predetermined retention capacitance. Accordingly, the SER resistance is enhanced. At the time of the third operation state, the SW4 is turned on, the SW2 and the SW3 are turned off, and the SW1 is turned on. At this time, the capacitors C1 and C2 each have a predetermined retention capacitance, and as compared with the case where the other ends of the capacitors C1 and C2 are fixed to the power supply potential VCC or the ground potential GND, breakage of the dielectric film 23 can be suppressed even if the H signal higher than usual or the L signal lower than usual is applied.

The present invention is not limited to the above described embodiments, and can be properly changed in the range without departing from the spirit of the invention. The predetermined speed should be properly set in accordance with the operation environment of the semiconductor memory device, the required characteristics and the like. The capacitor C1 or the capacitor C2 may be constituted of any type of capacitor. Namely, it may be constituted of any of a so-called trench type capacitor, a cylinder type capacitor, and a planar type capacitor. Two or more capacitors may be added to the respective cross-coupled nodes. The concrete configuration of the potential adjusting circuit 3 is optional.

What is claimed is:

1. A semiconductor memory device, comprising:
   a memory circuit containing a pair of memory nodes;
   a first capacitor comprising a first end and a second end, said first end being connected to one of said memory nodes;
   a second capacitor comprising a third end and a fourth end, said third end being connected to another of said memory nodes and said fourth end being connected to said second end; and
   a switch connected to said second end of said first capacitor and setting said second end at a first state when the semiconductor memory device operates in a first mode of operation and changing said second end into a second and different state when the semiconductor memory device operates in a second mode of operation having a speed different from that of said first mode,
   wherein said switch controls a voltage of said second end to use both of said capacitors during both of a data writing operation and a data reading operation in said second mode, and
   wherein said switch part brings said second end into a floating state when the semiconductor memory device operates at said second mode.

2. A semiconductor memory device, comprising:
   a memory circuit containing a pair of memory nodes:
   a first capacitor comprising a first end and a second end, said first end being connected to one of said memory nodes;
   a second capacitor comprising a third end and a fourth end, said third end being connected to another of said memory nodes and said fourth end being connected to said second end; and
   a switch connected to said second end of said first capacitor and setting said second end at a first state when the semiconductor memory device operates in a first mode of operation and changing said second end into a second and different state when the semiconductor memory device operates in a second mode of operation having a speed different from that of said first mode,
   wherein said switch controls a voltage of said second end to use both of said capacitors during both of a data writing operation and a data reading operation in said second mode, and
   wherein said switch sets a potential of said second end at a power supply potential or a ground potential when the semiconductor memory device operates at said first mode.

3. A semiconductor memory device, comprising:
   a memory circuit containing a pair of memory nodes;
   a first capacitor comprising a first end and a second end, said first end being connected to one of said memory nodes;
   a second capacitor comprising a third end and a fourth end, said third end being connected to another of said memory nodes and said fourth end being connected to said second end; and
   a switch connected to said second end of said first capacitor and setting said second end at a first state when the semiconductor memory device operates in a first mode of operation and changing said second end into a second and different state when the semiconductor memory device operates in a second mode of operation having a speed different from that of said first mode,
   wherein said switch controls a voltage of said second end to use both of said capacitors during both of a data writing operation and a data reading operation in said second mode, and
   wherein said switch sets a potential of said second end at one of a power supply potential and a ground potential when the semiconductor memory device operates by being given a predetermined voltage,
   wherein said switch sets a potential of said second end at a potential between said power supply potential and said ground potential when the semiconductor memory device operates by being given a voltage higher or lower than said predetermined voltage.

4. The semiconductor memory device as claimed in claim 1,
   wherein said switch changes said states of said second end based on a control signal from a control circuit.

5. The semiconductor memory device as claimed in claim 4,
   wherein said switch comprises a field effect transistor.

6. A semiconductor memory device, comprising:
   a memory circuit containing a pair of memory nodes:
   a first capacitor comprising a first end and a second end, said first end being connected to one of said memory nodes;
   a second capacitor comprising a third end and a fourth end, said third end being connected to another of said memory nodes and said fourth end being connected to said second end: and
   a switch connected to said second end of said first capacitor and setting said second end at a first state when the semiconductor memory device operates in a first mode of operation and changing said second end into a second and different state when the semiconductor memory device operates in a second mode of operation having a speed different from that of said first mode,
   wherein said switch controls a voltage of said second end to use both of said capacitors during both of a data writing operation and a data reading operation in said second mode,
   wherein said memory node includes a wiring region between a plurality of transistors,
   wherein said capacitor comprises a dielectric film on said wiring region, and
   wherein said dielectric film practically covers said wiring region.

* * * * *